United States Patent [19]

Metz

[11] Patent Number: 4,730,124

[45] Date of Patent: Mar. 8, 1988

[54] HIGH TRANSCONDUCTANCE COMPOSITE PNP TRANSISTOR

[75] Inventor: Arthur J. Metz, Gervais, Oreg.

[73] Assignee: Tektronix, Inc., Beaverton, Oreg.

[21] Appl. No.: 13,494

[22] Filed: Feb. 11, 1987

[51] Int. Cl.⁴ .................. H03K 17/60; H03K 3/01; G05F 3/16; H03F 3/04
[52] U.S. Cl. .................. 307/255; 307/296 R; 323/315; 330/288
[58] Field of Search .................. 307/255, 315, 296 A; 357/46; 330/288; 323/315–316

[56] References Cited

U.S. PATENT DOCUMENTS

| | | | |
|---|---|---|---|
| 3,757,137 | 5/1973 | Ahmed | 307/315 |
| 4,236,119 | 11/1980 | Battjes | 330/288 |
| 4,371,792 | 2/1983 | Dobkin | 307/255 |
| 4,580,068 | 4/1986 | Filliman | 307/243 |
| 4,633,100 | 12/1986 | van Taiji | 307/315 |

Primary Examiner—Stanley D. Miller
Assistant Examiner—B. P. Davis
Attorney, Agent, or Firm—George T. Noe

[57] ABSTRACT

A high-transconductance composite PNP transistor comprises a PNP transistor and three or more NPN transistors arranged in a three-terminal configuration which behaves as a PNP transistor, and yet exhibits high beta, alpha greater than one, and transconductance approaching infinity.

4 Claims, 3 Drawing Figures

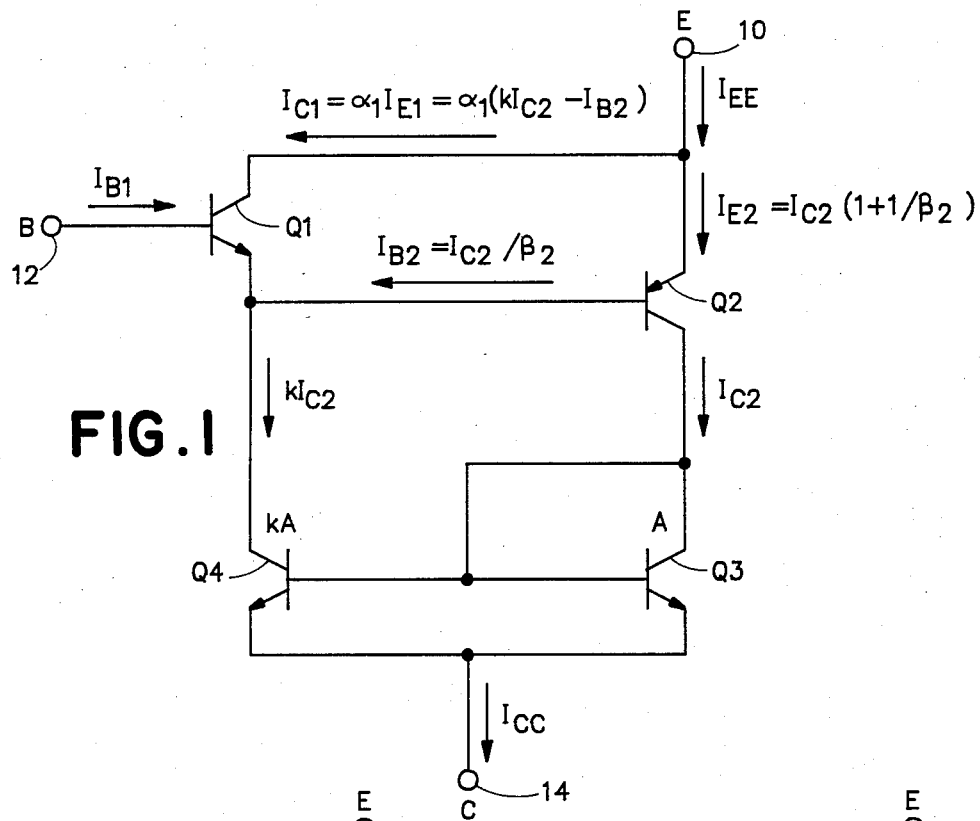
FIG.1
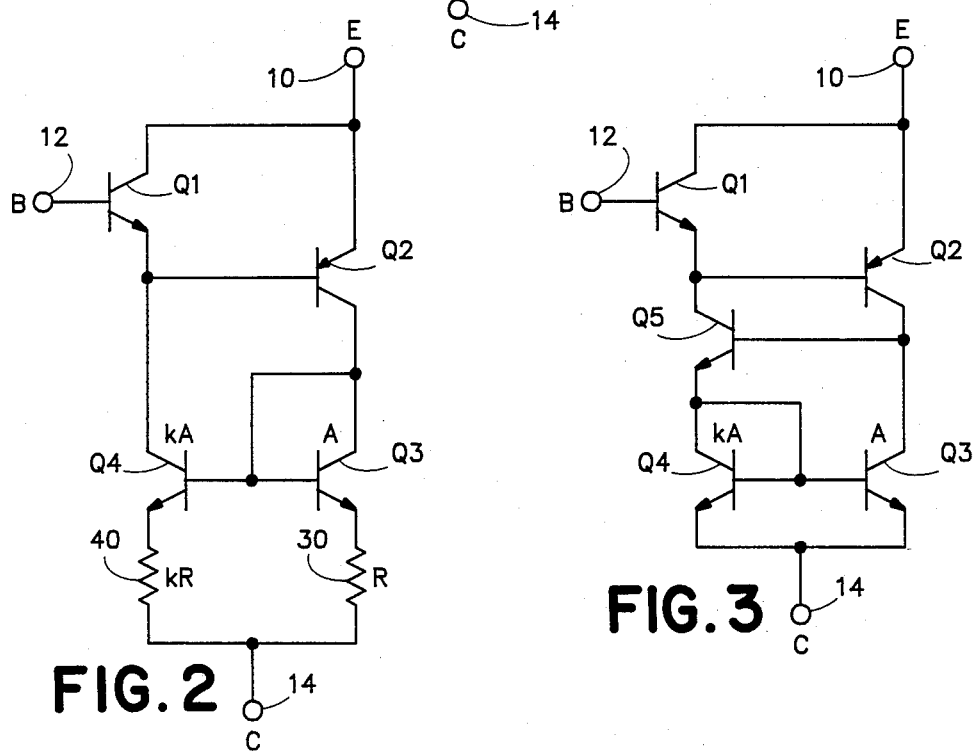
FIG.2
FIG.3

HIGH TRANSCONDUCTANCE COMPOSITE PNP TRANSISTOR

BACKGROUND OF THE INVENTION

In monolithic integrated circuit construction, suitable composite transistors have been constructed to enhance performance of NPN transistors. One such composite transistor is taught in U.S. Pat. No. 4,236,119 to Carl R. Battjes, wherein a three-terminal composite NPN transistor comprises three NPN transistors exhibiting current gain and frequency response characteristics that approximately double the performance of a single NPN transistor.

In U.S. Pat. No. 4,371,792 to Robert C. Dobkin, a three-terminal composite NPN transistor employing two NPN and two PNP transistors exhibits characteristics that are superior to those of a conventional single NPN transistor.

In electronic circuit design, the circuit constraints and biasing voltage available often warrant the use of PNP transistors. However, because of generally poor performance of PNP transistors, notably typically very low beta and poor linearity, circuit designers attempt to find solutions in which NPN transistors predominate.

SUMMARY OF THE INVENTION

In accordance with the present invention, a high transconductance composite PNP transistor exhibits a beta much higher than can be achieved with a simple integrated PNP, an alpha greater than unity, and has a transconductance approaching infinity. Also, the emitter-to-base voltage is nearly zero and has a low temperature coefficient. The basic composite transistor configuration comprises one PNP and three NPN transistors, and behaves like a PNP transistor. Several variations of the basic configuration have been developed for differing applications.

It is therefore one object of the present invention to provide a high transconductance composite PNP transistor.

It is another object of the present invention to provide an integrated composite PNP transistor having current gain and transconductance characteristics superior to those of a single PNP transistor.

Other objects, advantages, and attainments of the present invention will become obvious to those of ordinary skill in the art upon a reading of the following description when taken in conjunction with the accompanying drawings.

BRIEF DESCRIPTION OF THE DRAWINGS

FIG. 1 is a schematic diagram of a composite PNP transistor in accordance with the present invention;

FIG. 2 is a schematic diagram of a linearized composite PNP transistor in accordance with the present invention; and FIG. 3 is a schematic diagram of an alternative linearized composite PNP transistor in accordance with the present invention.

DETAILED DESCRIPTION OF THE INVENTION

Referring to FIG. 1, a PNP transistor Q2 and three NPN transistors Q1, Q3, and Q4 are configured to form a high-transconductance composite PNP transistor having external emitter (E), base (B), and collector (C) terminals 10, 12, and 14, respectively. The base of transistor Q1 is connected to terminal 12 and provides the base terminal for the composite transistor, while the emitter and collector thereof are connected to the base and emitter, respectively, of transistor Q2 so that the Q1 collector and Q2 emitter provide the emitter terminal 10. The emitters of transistors Q3 and Q4 are connected together to terminal 14, forming the collector of the composite transistor. Transistors Q3 and Q4 are connected in the well-known "current mirror" configuration, wherein the bases are connected together and transistor Q3 is a diode-connected transistor. The emitter-to-base junctions of transistors Q3 and Q4 have predetermined proportional areas A and kA, respectively, so that correspondingly, the currents produced by the current mirror $I_{C2}$ and $kI_{C2}$. The collector of transistor Q3 is connected to the collector transistor Q2 to provide standing current $I_{C2}$ therefor, and the collector of transistor Q4 is connected to the emitter of transistor Q1 to provide standing current $kI_{C2}$ therefor.

If the base currents of transistors Q1 and Q2 are ignored, transistor Q1 is forced to conduct k times the current through transistor Q2. Thus, it can be seen that if the input current into E terminal 10 is modulated, then both Q1 and Q2 emitter currents are modulated by very nearly the same percentage. This results in the incremental change $V_{BE}$ of transistor Q1 compensating for the incremental change $V_{BE}$ of transistor Q2 such that net $V_{BE}$ of the composite transistor, that is, the voltage between B terminal 12 and E terminal 10, is essentially constant even though emitter current has changed. It can be demonstrated academically using textbook transistor analysis that base-to-emitter voltage $V_{BE}$ of the composite transistor is independent of current $I_{C2}$ and output current. This implies that the transconductance, or $g_m$, of the composite transistor approaches infinity in the mathematical analyses. Thus it can be said that as a practical matter, in the physical implementation of the composite transistor of the present invention, transconductance is very high.

Note that with respect to the base of transistor Q2, the base of transistor Q1 and the emitter of transistor Q2 ideally have substantially the same voltage potential because of the voltage drops across the respective base-to-emitter junctions. Therefore, the voltage difference between terminals 12 and 10—that is, $V_{BE}$ of the composite transistor—can be made to approach zero by choosing proper device sizes (emitter areas). Note also that transistors Q1 and Q2 temperature compensate each other, even though the temperatures and forward voltages of the junctions may not be identical.

Looking further at the composite transistor of FIG. 1, it can be seen that the base current for the device is simply the base current for transistor Q1. The emitter current $I_{EE}$ is approximately equal to $(k/k+1)$ $I_{CC}$, where $I_{CC}=(k+1)I_{C2}$. Therefore, beta of the composite transistor may be maximized by choosing a small value of k. This can almost be inferred from inspection of the device where it can be seen that if k is chosen so small that practically all of the emitter and collector current for the device flow through transistors Q2 and Q3, base current for transistor Q1 will be very small, yielding a high beta for the composite transistor.

Note also that base current $I_{B1}$, which the base current for the composite transistor, adds to the emitter current $I_{EE}$, resulting in an alpha greater than one (implying negative beta). This causes the alpha of the composite transistor to increase as the beta of transistor Q1 decreases (because base current of transistor Q1 increases, increasing collector current $I_{CC}$ at terminal 14), which is useful in many designs to compensate for alpha losses in other NPN transistor stages. A good example of this is the situation in which the composite transistor collector current $I_{CC}$ is used to establish a reference current for an NPN current mirror, and the alpha compensation generated by the composite device offsets the alpha loss in a common base stage in the current mirror circuit. To maximize the alpha compensation, k should be large (e.g., 10 or greater) in order to maximize the standing current in transistor Q1.

Any factors causing the ratio of Q1 emitter current to Q2 emitter current to change with operating point will lower the effective transconductance of the composite transistor. One major cause of error is due to the Early effect (modulation of the base width by collector voltage) in the current mirror transistors Q3 and Q4. FIG. 2 shows a way of reducing this error by adding emitter degeneration. Here, resistors 30 and 40, having values of R and kR, respectively, are added between the emitters of transistors Q3 and Q4, respectively, and C terminal 14. Of course, addition of these resistors in any event aid in linearizing amplifier operation.

FIG. 3 shows a more compact method based on the Wilson current source (as taught in U.S. Pat. No. 3,588,672) of maintaining linearity over a wider dyanamic range of collector current $I_{CC}$ by modifying the current mirror by adding a fifth transistor Q5 and making Q4 the diode-connected transistor rather than Q3.

Transistor Q5 absorbs voltage variations that would result in nonlinearities.

While I have shown and described preferred embodiments of my invention, it will be apparent to those skilled in the art that many changes and modifications may be made without departing from my invention in its broader aspects. For example, if stability is a problem in a composite transistor constructed as taught herein, high frequency compensation in the form of an RC network may be added from Q2 emitter to Q4 base.

What I claim as being novel is:

1. A composite PNP transistor, comprising:
  a collector terminal, a base terminal, and an emitter terminal;
  a first transistor of PNP conductivity type having an emitter coupled to said emitter terminal;
  a second transistor of NPN conductivity type having a collector coupled to said emitter terminal, a base coupled to said base terminal, and an emitter coupled to a base of said first transistor; and
  third and fourth transistors of NPN conductivity type, each having a collector, a base, and an emitter, wherein the emitters of said third and fourth transistors are coupled together to said collector terminal, the bases of said third and fourth transistors are coupled together to the collector of said third transistor, and the collectors of said third and fourth transistors are coupled respectively to a collector of said second transistor and said emitter of said first transistor.

2. A composite PNP transistor in accordance with claim 1 further comprising a first resistor element coupled between the emitter of said third transistor and said collector terminal and a second resistor element coupled between the emitter of said fourth transistor and said collector terminal.

3. A composite PNP transistor in accordance with claim 1 further comprising a fifth transistor of NPN conductivity type interposed in series between said first and fourth transistors, wherein the a collector of said fifth transistor is coupled to said emitter of said first transistor, a base of said fifth transistor is coupled to the collectors of said second and third transistors, and an emitter of said fifth transistor is coupled to said collector of said fourth transistor, and wherein the bases of said third and fourth transistors are coupled to the collector of said fourth transistor instead of to the collector of said third transistor.

4. A composite PNP transistor in accordance with claim 1 wherein the emitter area of said fourth transistor is proportional to the emitter area of said third transistor by a predetermined proportionality factor.

* * * * *